United States Patent [19]
Li et al.

[11] Patent Number: 6,009,830
[45] Date of Patent: Jan. 4, 2000

[54] INDEPENDENT GAS FEEDS IN A PLASMA REACTOR

[75] Inventors: Haojiang Li, San Jose; Robert W. Wu, Pleasanton, both of Calif.

[73] Assignee: Applied Materials Inc., Santa Clara, Calif.

[21] Appl. No.: 08/975,907

[22] Filed: Nov. 21, 1997

[51] Int. Cl.$^7$ .................................................. C23C 16/00
[52] U.S. Cl. .................................. 118/723 R; 118/723 E; 118/723 ER; 118/723 IR; 156/345 C; 216/2; 216/37; 216/58; 216/63; 216/67; 216/68; 216/71; 216/74; 216/79; 216/99; 204/192.32; 204/192.37; 204/298.31; 204/298.33; 204/298.34
[58] Field of Search .................. 156/345 C; 204/192.32, 204/192.37, 298.31, 298.33, 298.34; 118/723 R, 723 E, 723 ER, 723 IR; 216/2, 37, 58, 63, 67, 68, 71, 74, 79, 99; 438/710, 711, 714, 726, 727, 729, 730

[56] References Cited

U.S. PATENT DOCUMENTS

| | | | |
|---|---|---|---|
| 5,356,515 | 10/1994 | Tahara et al. | 156/643 |
| 5,476,182 | 12/1995 | Ishizuka et al. | 156/345 C |
| 5,542,559 | 8/1996 | Kawakami et al. | 204/298.07 |
| 5,556,501 | 9/1996 | Collins et al. | 156/345 |
| 5,698,062 | 12/1997 | Sakamoto et al. | 204/298.33 |

*Primary Examiner*—Bruce F. Bell
*Attorney, Agent, or Firm*—Charles Guenzer

[57] ABSTRACT

A plasma etch reactor having independent gas feeds above the wafer and either at the sides or below the wafer. Preferably, a carrier gas such as argon is supplied from a showerhead electrode above the wafer while an etching gas is supplied from below. In the case of selectively etching an oxide over a non-oxide layer, the etchant gas should include one or more fluorocarbons.

28 Claims, 3 Drawing Sheets

INDEPENDENT GAS FEEDS IN A PLASMA REACTOR

FIELD OF THE INVENTION

The invention relates generally to plasma reactors and their operation. In particular, the invention relates to the supply of processing gases to a plasma reactor, more particularly a plasma etch reactor.

BACKGROUND ART

Plasma reactors are widely used in processing substrates such as semiconductor wafers in the fabrication of semiconductor integrated circuits. Two related fabrication processes for integrated circuits are plasma etching and plasma-enhanced chemical vapor deposition (CVD). In both these processes, a processing gas is admitted into a vacuum chamber and is excited into its plasma state. Conventionally, the plasma excitation has been performed by capacitively coupling RF energy through opposed electrodes, but more recent developments have emphasized a combination of capacitive coupling and inductive coupling through coils at the side of the chamber. The coils are placed away from the substrate and generate a plasma in a source region. The RF power applied to the pedestal in etching creates a DC bias voltage across the sheath of the plasma next to the wafer and thus controls the energy of ions expelled from the plasma to the wafer. The plasma-excited processing gas and its ions and radicals interact with the substrate. In etching, the processing gas removes parts of the substrate. On the other hand, in chemical vapor deposition, part of the processing gas deposits on the substrate.

In many types of plasma processing, the active gas is entrained in an inactive carrier gas, and both gases are excited into a plasma. A carrier gas is used for a number of reasons. The additional gas produces a higher chamber pressure and thus helps to sustain the plasma above a critical minimum pressure. The carrier gas acts as a diluent and promotes uniformity. The unreactive carrier gas balances the electro-negativity of the plasma. In reactive ion etching, the energy of the argon ions impinging upon the substrate helps to activate the reaction between the bonded atoms of the substrate and the active components of the plasma gas. Argon is the usual carrier gas in etching, but helium is another common carrier gas.

Advanced semiconductor integrated circuits have narrow limits of layer thicknesses and similar parameters. Accordingly, one of the most critical measures of the utility of a new process or of an old process practiced on a new tool is the uniformity of the process across the wafer. For example, what is the difference in the etching rate between the center and the edge of the wafer. A concomitant concern, not further discussed here, is the uniformity or reproducibility between wafers. Uniformity is considered as a statistical problem with random distributions having a median value but with long tails about the median. The median value $\mu$ of the distribution is not usually a problem since the process timing can usually be adjusted. However, the standard deviation $\sigma$ (here defined simply as the average deviation from the median) does present a problem. For integrated circuits having millions of devices and requiring hundreds of steps to manufacture, a failure of any one of those devices caused by any one of the steps will produce a defective device. As a result, if a process produces for some fabrication parameter a measured mean $\mu$ and standard deviation $\sigma$, and $\mu+\sigma$ and $\mu-\sigma$ fall well within the predicted window of operability for the device, the statistics may be totally unsatisfactory if the statistics over the entire device and process require a confidence level of, for example, $5\sigma$ to attain a low enough defect level. That is, the satisfactory device parameters must fall between $\mu+5\sigma$ and $\mu-5\sigma$. It is for reasons like these that $\sigma$ must be reduced and why uniformities over the wafer of 5% or even 1% are being required.

The increasing demands for uniformity have been occurring at the same time that wafer size has been increasing because of the economies of scale occurring in the production of the larger wafers. Over the past ten years, wafer sizes have been increasing from 100 mm to 150 mm, and now the current standard for high-capacity production is 200 mm. Currently, much development effort is being expended on equipment for 300 mm wafers, which are expected to reach production lines in a few years. The uniformity requirements remain for the larger wafers. Not only are the statistics unfavorable for the larger areas, but there is an economic desire to restrict the volume of the larger chambers because of the expensive clean room floor space they occupy. That is, edge effects can no longer be economically reduced by simply increasing the volume of the chamber.

Processing gas is usually injected into a plasma processing chamber through one or more ports arranged in a somewhat similar geometry. For example, the counter electrode facing a pedestal electrode holding the wafer may be a showerhead electrode having a large number of small apertures distributed over the area of the showerhead generally corresponding to the area of the wafer and directed at the wafer. In another example, a gas distribution ring may surround the area between the two electrodes and have multiple apertures directing the gas toward the intermediate area. However, prior art is known in which multiple gas ports of substantially different geometries are used, as disclosed by Collins in U.S. Pat. No. 5,556,501 and in U.S. patent application, Ser. No. 08/734,797, filed Oct. 23, 1996. Tahara et al. have disclosed in U.S. Pat. No. 5,356,515 an oxide etch chamber in which the showerhead is supplied with $CF_4$, $CHF_3$, CO, and Ar while an annular port surrounding the showerhead is supplied only with CO.

SUMMARY OF THE INVENTION

A plasma reactor and its method of operation in which processing gas is input to the chamber through multiple independent ports located at geometrically distinct locations. In a plasma etch reactor, particularly an oxide etcher, the etchant gas, for example one or more fluorocarbons or hydrofluorocarbons such as $C_3F_8$, $CHF_3$, or $C_4F_8$, is preferentially input from a location below the location at which an inactive carrier gas such as argon is preferentially input.

DETAILED DESCRIPTION OF THE PREFERRED EMBODIMENTS

We have found that better uniformity can be achieved by independently controlling injecting different components of the processing gas from different parts of the chamber. Oxide etching uniformity is greatly improved by injecting the active etching components from ports around the periphery of the wafer and by injecting the carrier gas from a showerhead above the wafer.

Figure 1:
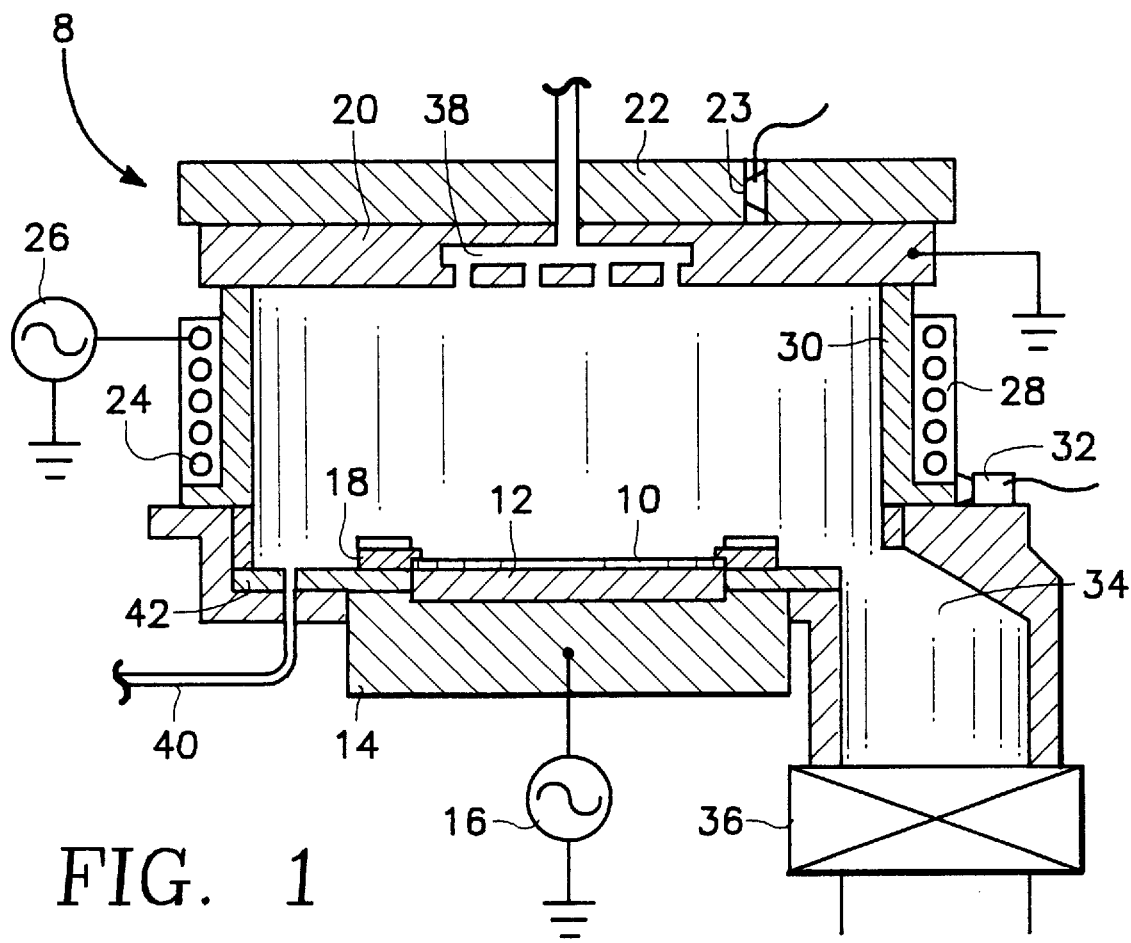
FIG. 1 is a schematic cross-sectional view of a plasma oxide etch reactor incorporating the independent gas feeds of the invention.

An example of a high-density plasma (HDP) oxide etching reactor 8 is illustrated in the schematic cross-sectional view of FIG. 1. This illustration generally conforms to the HDP Centura Oxide Etch Reactor available from Applied Materials, Inc. of Santa Clara, Calif.

A wafer 10 is held on an electrostatic chuck 12 at the top of a pedestal 14, which is cooled with chilling water. An RF power supply 16 operating at 1.8 MHz supplies wafer bias power to the pedestal electrode 14 and thereby controls the energy of the ions extracted from the plasma. A quartz non-contact clamp ring 18 is positioned above the periphery of the wafer 10 and protects the wafer edge. A grounded silicon top plate 20 is positioned above the wafer 10 and acts as the counter-electrode to the biased pedestal electrode 14. The top plate 20 is made of silicon to scavenge fluorine from the plasma in the etching chemistry to be described below. A top heater 22 controls the temperature of the silicon top plate 20, an important parameter for the scavenging operation, and a thermocouple 23 monitors the roof temperature.

An inductive coil 24 surrounds the walls of the chamber 8 and is supplied by a second RF power source 26 with power, for example, at 2.0 MHz, which the coil 24 inductively couples into the plasma within the chamber. The coil 24 is embedded in a heater jacket 28 which heats a quartz sidewall 30 of the chamber 8. Another thermocouple 32 monitors the sidewall temperature. An unillustrated turbo pump vacuum pumps the chamber 8 through a pumping port 34 and a throttle valve 36 down to a base pressure in the low milliTorr range at a pumping speed of 1000 liter/s.

Processing gases are supplied to the chamber 8 through two independent ports. A top gas feed 38 is formed in the silicon top plate 20. It has a distribution cavity extending horizontally from the center of the roof 20. The cavity is supplied by a top gas supply line and is connected to the chamber interior by a plurality of narrow holes extending through the roof 20. The top gas feed 38 thus amounts to a showerhead having a diameter smaller than that of the wafer 10 and positioned over it. The showerhead directs its gas toward the face of the wafer 10 in a direction substantially perpendicular to the face. The diameter of the showerhead is about 11 2 mm for a reactor 8 processing a 200 mm wafer. Schneider et al. describe the top gas feed 38 in more detail in U.S. patent application, Ser. No. 08/734,015, filed Oct. 18, 1996. A bottom gas feed 40 penetrates the chamber 8 through a quartz bottom liner 42 that is generally level with the top of the pedestal 14. The bottom gas feed 38 is positioned radially outside of the pedestal 14 and directs its gas upwardly away from the wafer 14. In the tested configuration, there was a single aperture of the bottom gas feed 38, but other chambers have two or more apertures equally distributed about the periphery of the pedestal 14.

Although the above description applies to the Centura reactor, the invention has also been tested on a prototype reactor having a conical dome with a conforming inductive coil. The conical dome reactor is described by Schneider et al. in U.S. patent application, Ser. No. 08/734,015, filed Oct. 18, 1996, incorporated herein by reference. The invention is also applicable to the IPS etch reactor available from Applied Materials in which two nested solenoidal coils are positioned in back of a flat silicon roof.

The inductive coupling enables the exciting of a high-density plasma, that is, one having a plasma density of above $10^{11} cm^{-3}$ in a source region remote from the wafer 10. A high-density plasma not only etches more quickly, but allows a more controlled and selective etch depending upon other process parameters. High-density plasmas are available in other types of reactors, for example, by electron cyclotron resonance (ECR) at gigahertz frequencies and from remote plasma sources.

Figure 2:
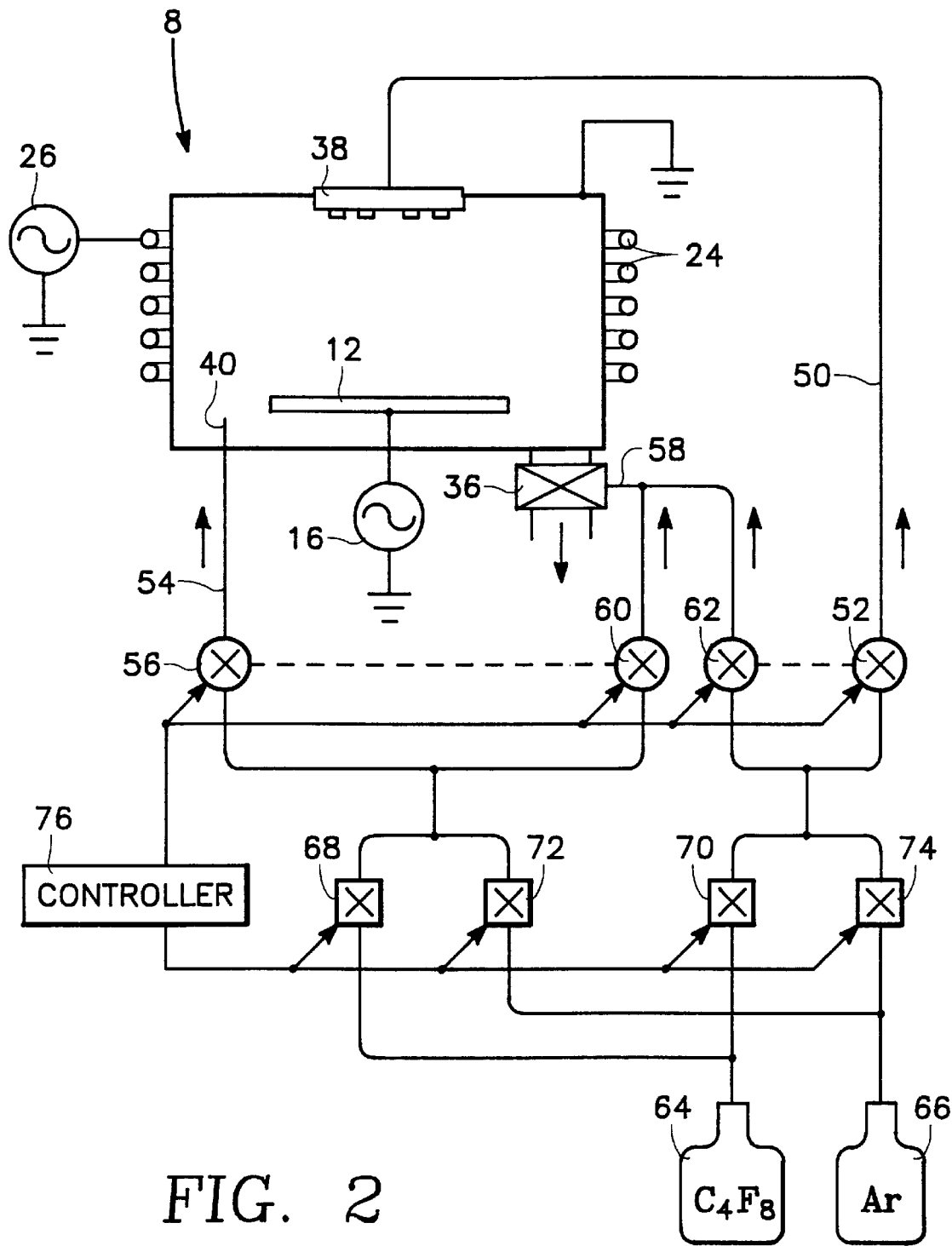
FIG. 2 is a schematic illustrations of the gas supply and control utilized in the reactor of FIG. 1.

A schematic view is shown in FIG. 2 of the chamber 8 of FIG. 1 or other type of etch chamber in which is emphasized its gas plumbing. The chamber plumbing was configured for the tests confirming the invention, and more economical plumbing can be easily envisioned and designed. The top gas feed 38 is supplied by a top gas line 50 through a first pneumatically operated final valve 52. Similarly, the bottom gas feed 40 is supplied by a bottom gas line 54 through a second pneumatically operated final valve 56. A dump line 58 dumps any gas it receives to the throttle valve 36, whence it is exhausted from the system. Two pneumatically operated dump valves 60, 62 respectively connect the top and bottom gas lines 50, 54 to the dump line 58 and operate in complementary fashion to the associated final valves 56, 52 so that gas always finds a low pressure destination.

It has been found that selective oxide etching can be achieved in a high-density plasma reactor by a combination of a fluorocarbon etchant gas and a fluorine scavenger. Examples of fluorocarbon gases are the fluorinated alkanes $CF_4$, $C_2F_6$, $C_3F_8$, $C_4F_8$, and $CHF_3$, etc. A fluorine scavenger, when in contact with the plasma and when properly activated, scavenges extra atomic fluorine from the plasma. As a result, a polymer of low fluorine content tends to form on the wafer being etched. However, the oxygen content of an underlying oxide layer oxidizes the incipient polymer, causing it to dissociate and leaving the oxide exposed to etching. On the other hand, the polymer builds up over silicon or silicon nitride and protects it from etching. Solid silicon is the favored fluorine scavenger. It can be thermally activated for scavenging, or alternatively some have suggested applying an RF bias to the silicon counter electrode 20 to activate the silicon.

Figure 3:
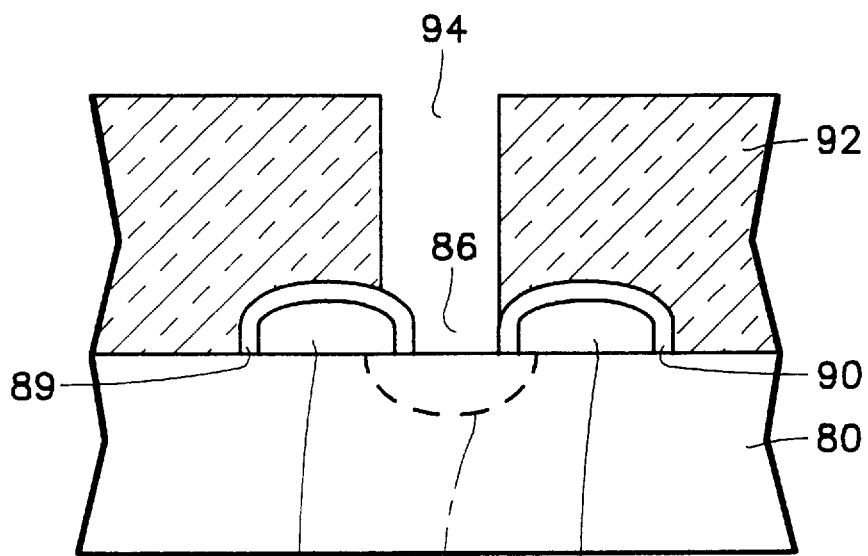
FIG. 3 is a cross-sectional view of a self-aligned contact.

A particularly demanding etch process is for a self-aligned contact (SAC). As illustrated in the cross-sectional view of FIG. 3. A silicon substrate 80 has two polysilicon lines 82, 84 formed on its surface with a narrow gap 86 between them. Each polysilicon line 82, 84 forms a polysilicon gate structure. The gap 86 between the polysilicon lines 82, 84 defines a self-aligned mask form forming a heavily doped $n^+$ or $p^+$ region 88 that is the source for both gate structures. The polysilicon lines 82, 84 are covered with thin conformal layers 89, 90 of silicon nitride ($Si_3N_4$), which is a fairly good electrical insulator, and the structure is then covered with an interlevel dielectric or oxide layer 92. Thereafter, a contact hole 94 is photolithographically defined in an oxide etch process for contacting the source region 86. However, the photolithography involving the unillustrated photoresist layer may be insufficiently precise to exactly locate the contact hole 94 over the gap 86 between the polysilicon lines 82, 84. In the SAC process, the oxide etch is selective not only to the silicon substrate 80 but also to the nitride layers 89, 90, thereby providing a considerable margin for alignment error in the photolithography. In an alternative SAC process, the conformal nitride layer 89, 90 also covers the bottom of the gap 86. After the oxide etch, the bottom nitride is removed by directional sputtering. In this case, the oxide etch must be selective to nitride. After completion of the etching, the contact hole 94 is metallized in well known processes to contact the underlying silicon layer 80. Unillustrated drain regions associated with each gate structures complete the most important parts of two MOS transistors.

In the preferred embodiment, as shown in FIG. 2, the processing gas consists of an etchant gas, for example, $C_4F_8$ (octafluoro cyclobutane), and a carrier gas of argon supplied from respective sources 64, 66. However, other fluorocarbon etchant gases may be used for etching oxide, e.g., $CHF_3$, $C_2F_8$, $C_3F_8$, etc. In this experimental configuration, the $C_4F_8$ source 64 is connected to both the top and bottom gas lines 50, 54 through respective mass flow controllers 68, 70, and the Ar source 66 is similarly connected through respective mass flow controllers 72, 74. Thereby, any gas combination can be supplied to either gas feed 38, 40. A computer-based controller 76 of the etching system controls the bi-state openings of the final valves 52, 56, 60, 62 and the degree of opening of the mass flow controllers 68, 70, 72, 74, based upon the process recipe being used. Connections of the controller 76 to other controlled elements are not shown.

The general operating conditions for a series of tests are summarized in TABLE 1.

TABLE 1

| | |
|---|---|
| $C_4F_8$ Flow | 7, 10, 12 sccm |
| Ar Flow | 15, 325, 500 sccm |
| Source Power | 1200 W |
| Bias Power | 1400 W |
| Pressure | 5.5 mTorr |
| Roof Temperature | 220° C. |
| Wall Temperature | 215° C. |
| Chiller Temperature | 10° C. |
| He Pressure | 7 Torr |

A series of flows were used for both the etchant and the carrier gas. The roof and wall temperature were held in their normal ranges to thermally activate the silicon-based scavenger of the fluorine etchant while avoiding polymer buildup on the wall. The pedestal was kept cold, and the helium transfer gas used between the wafer and the pedestal transferred heat from the wafer to the pedestal.

Among all the combinations, it has been found that supplying the $C4F_8$ etchant gas only to the bottom gas feed and supplying the Ar carrier gas only to the top gas feed produces the best performance in terms of etch stop and oxide etch rate uniformity. Etch stop is the condition that a narrow hole being etched through an oxide layer stops etching at a certain depth due to etchant depletion or heavy polymerization in holes. Further exposure to the etching environment does not deepen the hole. This same result is obtained with the conical dome mentioned before.

Figure 4:
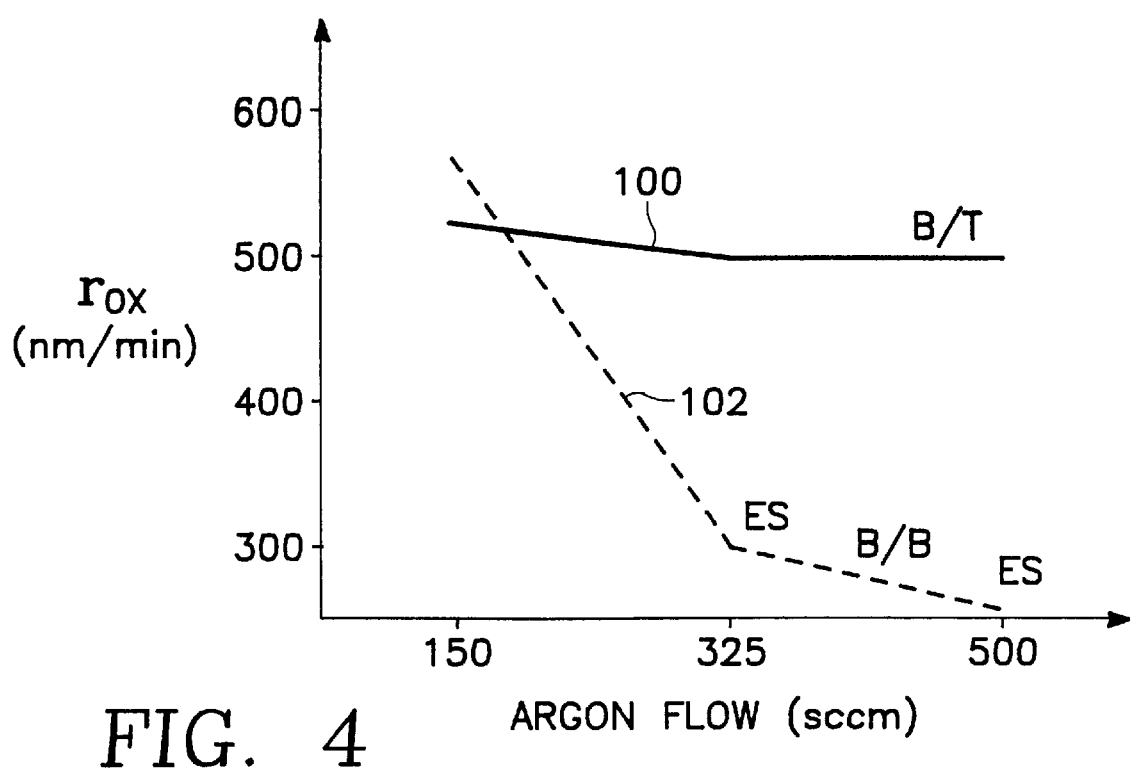
FIG. 4 is a graph of the oxide etch uniformity as a function of the flow of carrier gas as achieved by the invention.
Figure 5:
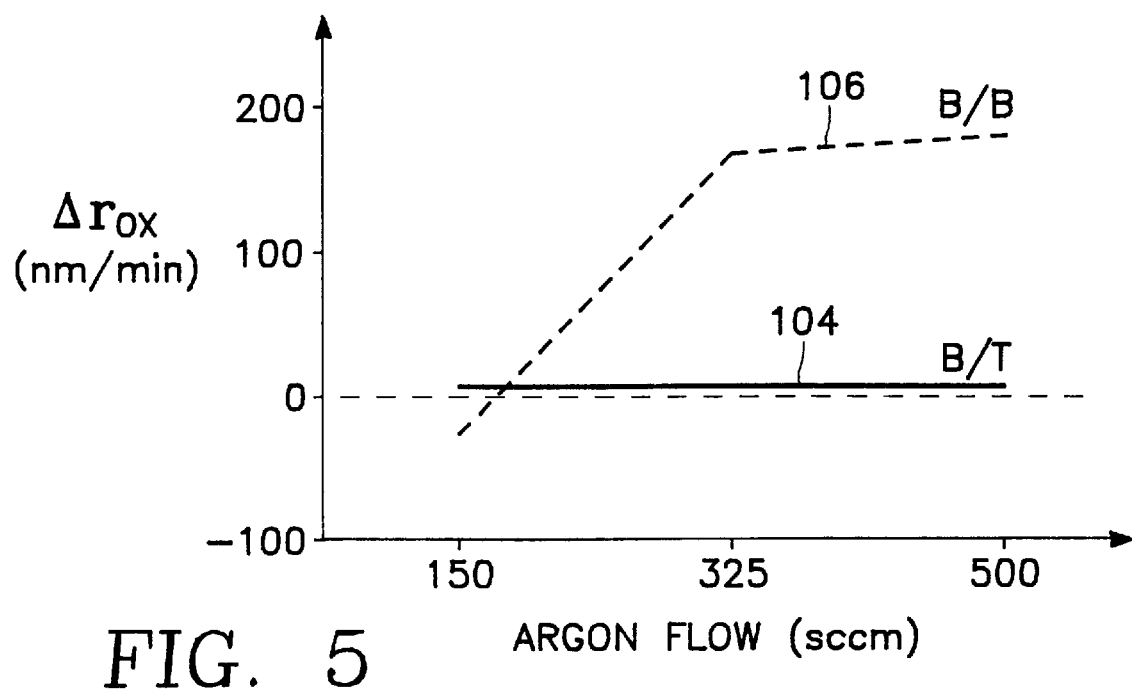
FIG. 5 is a graph of the oxide etch rate as a function of the flow of carrier gas complementing the data of FIG. 4.

Data from two sets of experiments are presented in FIGS. 4 and 5. The center oxide etch rate $r_{ox}$ for features have critical dimensions of 0.5 $\mu$m was measured as a function of argon flow rate for a fixed $C_4F_8$ flow rate of 10 sccm. The oxide etch rates $r_{ox}$ are shown in FIG. 4 by trace 100 for the inventive process of $C_4F_8$ supplied from the bottom and argon from the top (B/T) and by trace 102 for the conventional process of both gases supplied from the bottom (B/B). The conventional process experienced etch stop (ES) at higher argon flows. The etch rate difference $\Delta r_{ox}$ between the edge and center were measured for the same conditions. The uniformity results are shown in FIG. 5 by trace 104 for the inventive process of $C_4F_8$ at the top and argon at the bottom (B/T) and by trace 106 for the conventional B/B process.

The uniformity of the inventive process is remarkable, measured to be about 3% (about 15 nm/min) compared to the conventional non-uniformity of 150 to 200 nm/min. Not only is the dispersion very small, but it is substantially independent of argon gas flow, in contrast to the conventional results. Also, the etch rate depends only weakly on the argon gas flow. As a result, the flow of argon does not need to be tightly controlled to achieve a desired physical structure. That is, the processing window is wide.

Although the results presented above use only a single etchant species, more preferred oxide processing gases include other species. For example, for a SAC (self-aligned contact) process, in which the oxide etch needs to stop on both silicon and silicon nitride, preferred examples include: (1) $C_4F8+Ar$; (2) $C_4F_8+Ar+CH_2F_2$; (3) $C_3F_8+Ar+CH_2F_2$; and (4) $CHF_3+Ar+CH_2F_2$, among others. These various chemistries are of themselves not part of the present invention and are presented here for completeness and on behalf of the true inventors. For very high oxide over silicon selectivity, the etchant species include a hydrogen-free fluorocarbon ($C_4F_8$, $CF_4$, $C_2F_6$, etc.) and a hydrofluorocarbon, such as $CHF_3$. As Tahara et al. disclose, carbon monoxide (CO) may be added as an etchant species for oxide selectivity and improves the etch stop margin. However, we have shown very good results with substantially no CO being supplied. By substantially no CO is meant no more than 10% and certainly no more than 25% of the amount of the fluorocarbon or hydrofluorocarbons being used.

Although the described embodiment injected all the etchant gas from below and all the carrier gas from above, it is clear that the effect is not limited to such a complete division but will be observed to greater or lesser extent if a larger fraction of the top feed is composed of the carrier gas than of the bottom feed.

Although the described embodiment injected the etchant gas from below the wafer and directly upwardly away from the wafer, similar effects should be observed by injecting the etchant gas from one or more locations on the chamber wall located between the top gas feed and the wafer. Collins et al. have disclosed such side ports. These side ports may direct the etchant gas inwardly generally toward the axis of the reactor chamber.

The differential use of differently located ports enables the balancing of the species distribution around the chamber among the ions, radicals, and by-products of the plasma-induced reactions. That is, the invention provides a valuable control of the etching process with only slight increase in system complexity.

What is claimed is:

1. A substrate etching method, comprising the steps of:
    supporting a substrate to be processed on a surface extending along a plane of a support within a plasma processing chamber;
    injecting a chemically inactive carrier gas from a gas showerhead electrode located above said support and directed in a first direction generally toward a volume over said support;
    holding said gas showerhead electrode at a predetermined electrical potential;
    injecting an etchant gas from one or more lower ports located below said gas showerhead electrode in a second direction at least partially opposite said first direction, wherein a flow of gas through said gas showerhead electrode has a greater proportion of said carrier gas than does a flow of gas through said one or more lower ports; and
    exciting s aid carrier gas and said etchant gas into a plasma.

2. The method of claim 1, wherein substantially all of said etchant gas is injected from said one or more lower ports.

3. The method of claim 1, wherein said carrier gas comprises argon.

4. The method of claim 3, wherein said etchant gas comprises a fluorocarbon.

5. The method of claim 4, wherein said etchant gas comprises a hydrogen-free fluorocarbon and a hydrofluorocarbon.

6. The method of claim 4, wherein said fluorocarbon comprises $C_4F_8$.

7. The method of claim 4, wherein said etchant gas comprises substantially no carbon monoxide.

8. The method of claim 1, wherein said exciting step excites at least said carrier gas into a high-density plasma.

9. The method claim 1, wherein said exciting step includes inductively coupling power into said chamber.

10. The method of claim 9, further comprising applying RF power to said support.

11. The method of claim 10, wherein said carrier as comprises argon and said etchant gas comprises a fluorocarbon.

12. The method of claim 1, wherein said lower ports are located on a side of said plane opposite said gas showerhead electrode.

13. The method of claim 12, wherein said lower ports are located outside a periphery of said substrate.

14. A method of etching a substrate having an oxide layer over a non-oxide layer, comprising the steps of:

supporting said substrate to be processed on a support within a plasma processing chamber;

injecting an inactive carrier gas from a showerhead electrode along a first direction into a first side of a plasma source region, wherein said showerhead electrode is located opposite of said plasma source region from said support;

injecting an etchant gas from at least one lower port into a second side of said plasma source region opposite of said first side toward said support, wherein a flow of said etchant gas through said showerhead electrode has a greater proportion of said carrier gas than does a flow of gas through said at least one lower port;

holding said showerhead electrode at a predetermined electrical potential;

exciting at least said carrier gas into a high-density plasma in said plasma source region; and applying RF biasing power to said support.

15. The method of claim 14, wherein said exciting step includes inductively coupling RF power into said plasma source region.

16. The method of claim 14, wherein said carrier gas comprises.

17. The method of claim 14, wherein said etchant gas comprises a fluorocarbon.

18. The method of claim 17, wherein said non-oxide layer comprises silicon.

19. The method of claim 18, wherein said non-oxide layer comprises silicon nitride.

20. The process of claim 19, wherein said fluorocarbon comprises $C_4F_8$.

21. The process of claim 17, wherein said etchant gas comprises a first and a second fluorocarbon gas.

22. The method of claim 21, wherein said first fluorocarbon gas comprises a hydrogen-free fluorocarbon and said second fluorocarbon gas comprises a hydrofluorocarbon.

23. The method of claim 14, wherein flows of said etchant and inactive carrier gas are selected to increase uniformity of etching across said substrate. argon.

24. The method of claim 14, wherein said lower port is located on a side of said plane opposite said showerhead electrode.

25. The method of claim 24, wherein said lower port is located outside a periphery of said substrate.

26. A plasma etch apparatus, comprising:

a vacuum chamber;

a top electrode having a top gas feed therein;

a bottom electrode facing said top electrode and facing said top electrode;

a bottom gas feed disposed within said chamber on a side of said top gas feed facing said bottom electrode and directing a gas flow into said chamber toward said top electrode;

a source of an etchant gas;

a source of a carrier gas; and valving disposed between said two sources and said top and bottom gas feeds capable of varying a proportion of said etchant gas to said carrier gas delivered to each of said top and bottom gas feeds.

27. The apparatus of claim 26, further comprising an RF inductive coil adjacent to said chamber.

28. The method of claim 26, wherein said bottom gas feed is located outside a periphery of said bottom electrode.

* * * * *